(12) United States Patent
Saito et al.

(10) Patent No.: US 9,349,721 B2
(45) Date of Patent: May 24, 2016

(54) SEMICONDUCTOR DEVICE

(71) Applicant: KABUSHIKI KAISHA TOSHIBA, Tokyo (JP)

(72) Inventors: Wataru Saito, Hyogo (JP); Syotaro Ono, Hyogo (JP); Toshiyuki Naka, Kanagawa (JP); Shunji Taniuchi, Ishikawa (JP); Hiroaki Yamashita, Hyogo (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/246,437

(22) Filed: Apr. 7, 2014

(65) Prior Publication Data

US 2014/0284704 A1 Sep. 25, 2014

Related U.S. Application Data

(62) Division of application No. 13/612,200, filed on Sep. 12, 2012, now abandoned.

(30) Foreign Application Priority Data

Sep. 29, 2011 (JP) .................. 2011-215726

(51) Int. Cl.
*H01L 27/06* (2006.01)
*H01L 27/07* (2006.01)
(Continued)

(52) U.S. Cl.
CPC ........ *H01L 27/0629* (2013.01); *H01L 27/0727* (2013.01); *H01L 29/7803* (2013.01);
(Continued)

(58) Field of Classification Search
CPC ............ H01L 27/0629; H01L 27/0727; H01L 27/0248; H01L 29/407; H01L 29/42373; H01L 29/7803–29/7806; H01L 29/7808; H01L 29/0634; H01L 29/0878; H01L 29/1085; H01L 29/868; H01L 29/866

See application file for complete search history.

(56) References Cited

U.S. PATENT DOCUMENTS 5,304,802 A * 4/1994 Kumagai ............ H01L 27/0251 257/133
5,973,359 A * 10/1999 Kobayashi .......... H01L 27/0251 257/328

(Continued)

FOREIGN PATENT DOCUMENTS

EP 1041634 A1 10/2000
JP H01185971 A 7/1989

(Continued)

OTHER PUBLICATIONS

Content Protection for Recordable Media Specification—SD Memory Card Book SD-SD (Separate Delivery) Part, issued by 4C Entity, Revision 0.94, dated Jul. 19, 2012, 211 pages.

(Continued)

*Primary Examiner* — Galina Yushina
(74) *Attorney, Agent, or Firm* — Patterson & Sheridan, LLP

(57) ABSTRACT

A semiconductor device comprising: a Metal Oxide Semiconductor Field Effect Transistor including: a semiconductor substrate including a first semiconductor layer of a first conductivity type; second semiconductor layers of a second conductivity type extending in a depth direction from one surface of the semiconductor substrate, and having space each other; a first diode including a fifth semiconductor layer of the second conductivity type contacting the second semiconductor layer in one surface side of the semiconductor substrate, the first semiconductor layer and the second semiconductor layers; and an anode of the second diode connected to an anode of the first diode.

13 Claims, 12 Drawing Sheets

(51) Int. Cl.
  *H01L 29/78* (2006.01)
  *H01L 29/868* (2006.01)
  *H01L 29/872* (2006.01)
  *H01L 29/06* (2006.01)
  *H01L 29/40* (2006.01)
  *H01L 29/423* (2006.01)
  *H01L 29/08* (2006.01)
  *H01L 29/10* (2006.01)

(52) U.S. Cl.
  CPC ........ *H01L29/7804* (2013.01); *H01L 29/7805* (2013.01); *H01L 29/7806* (2013.01); *H01L 29/7808* (2013.01); *H01L 29/7813* (2013.01); *H01L 29/7827* (2013.01); *H01L 29/868* (2013.01); *H01L 29/872* (2013.01); *H01L 29/0634* (2013.01); *H01L 29/0878* (2013.01); *H01L 29/1095* (2013.01); *H01L 29/407* (2013.01); *H01L 29/42372* (2013.01)

(56) References Cited

U.S. PATENT DOCUMENTS

| | | | |
|---|---|---|---|
| 6,888,195 B2 | 5/2005 | Saito et al. | |
| 6,946,707 B2 | 9/2005 | Voldman | |
| 7,759,732 B2 | 7/2010 | Saito et al. | |
| 2002/0167020 A1* | 11/2002 | Iwamoto | H01L 29/7802 257/110 |
| 2004/0007736 A1 | 1/2004 | Deboy et al. | |
| 2004/0021178 A1 | 2/2004 | Larson | |
| 2004/0056306 A1 | 3/2004 | Saito et al. | |
| 2004/0108568 A1 | 6/2004 | Qu | |
| 2004/0245574 A1* | 12/2004 | Ker | H01L 29/0657 257/356 |
| 2007/0200143 A1 | 8/2007 | Saito et al. | |

FOREIGN PATENT DOCUMENTS

| | | |
|---|---|---|
| JP | H0371673 A | 3/1991 |
| JP | H05183114 A | 7/1993 |
| JP | H06188425 A | 7/1994 |
| JP | 2001085682 A | 3/2001 |
| JP | 2006513580 A | 4/2006 |
| JP | 2006332182 A | 12/2006 |
| WO | 2004068590 A1 | 8/2004 |

OTHER PUBLICATIONS

Japanese Office Action dated Dec. 13, 2013, filed in Japanese counterpart Application No. 2011-215726, 4 pages (with translation).
Chinese Office Action dated Nov. 3, 2014, filed in Chinese counterpart Application No. 201210313561.8, 25 pages (with translation).

* cited by examiner

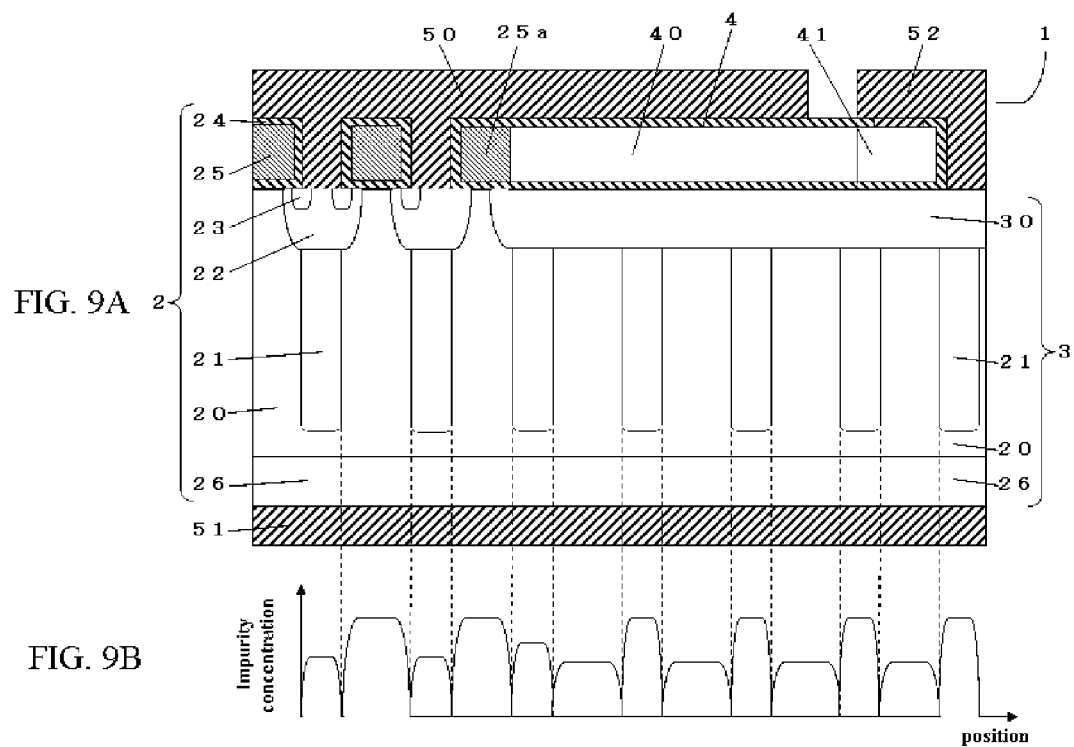

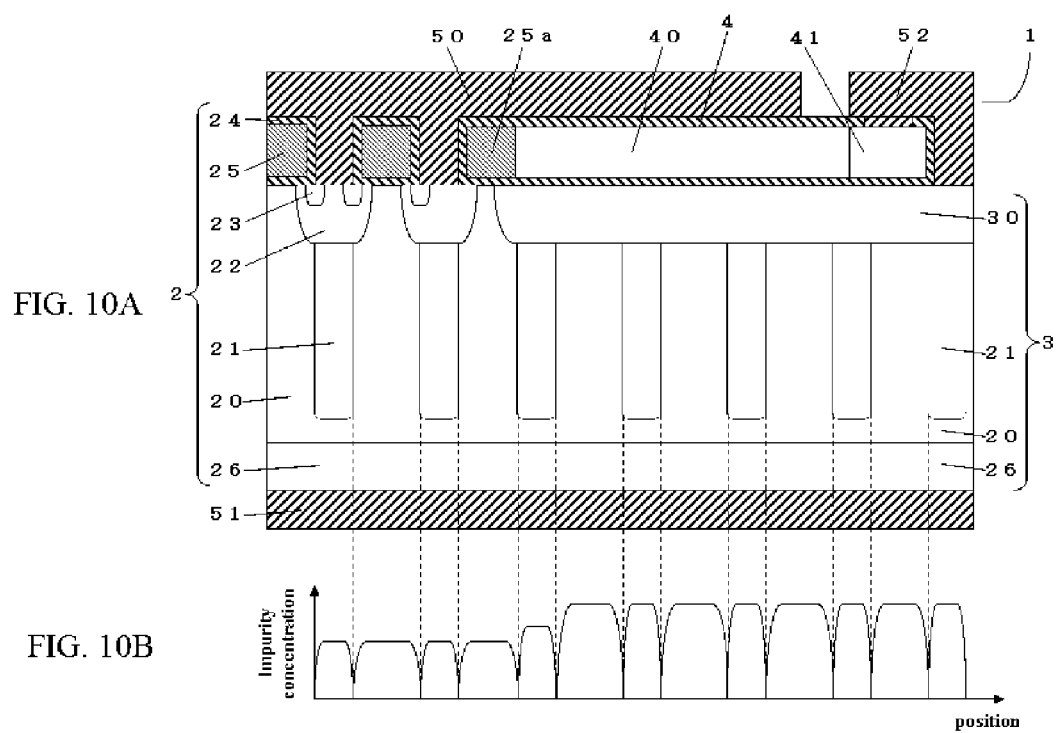

SEMICONDUCTOR DEVICE

CROSS-REFERENCE TO RELATED APPLICATION

This application is a division of U.S. patent application Ser. No. 13/612,200, filed on Sep. 12, 2012, which is based upon and claims the benefit of priority from the prior Japanese Patent Application No. 2012-215726, filed on Sep. 29, 2011, the entire contents of each of which are incorporated herein by reference.

FIELD

Embodiments described herein relate to a semiconductor device.

BACKGROUND

Recently, a vertical power MOSFET (Metal Oxide Semiconductor Field Effect Transistor) opens up a new market in fields such as a high-voltage switching supply and a mobile communication equipment. Since the vertical power MOSFET is used in a power management circuit and the safety circuit of a lithium-ion battery, it is required characteristics of low ON resistance, high breakdown voltage, low voltage operation and reducing switching loss.

The vertical power MOSFET has functions to switch with applied high voltage and to clamp an electrical voltage generated by an avalanche breakdown in the case of applied overvoltage. These functions prevent components in the circuit from being insulation breakdown.

The avalanche breakdown means an amount of current or energy in the avalanche state. It is available to have a low breakdown voltage of a semiconductor device for improving the avalanche breakdown. However, if the vertical power MOSFET has a low breakdown voltage, its ON resistance increases.

DESCRIPTION OF THE DRAWINGS

FIG. 9A is a cross-sectional view of an alternative of the semiconductor device according to the fourth embodiment;

FIG. 9B is a graph illustrating an impurity concentration profile along the cross direction of the portion illustrated in FIG. 9A;

FIG. 10A is a cross-sectional view of an alternative of the semiconductor device according to alternative of the fourth embodiment;

FIG. 10B is a graph illustrating an impurity concentration profile along the cross direction of the portion illustrated in FIG. 10A;

DETAILED DESCRIPTION

Figure 1:
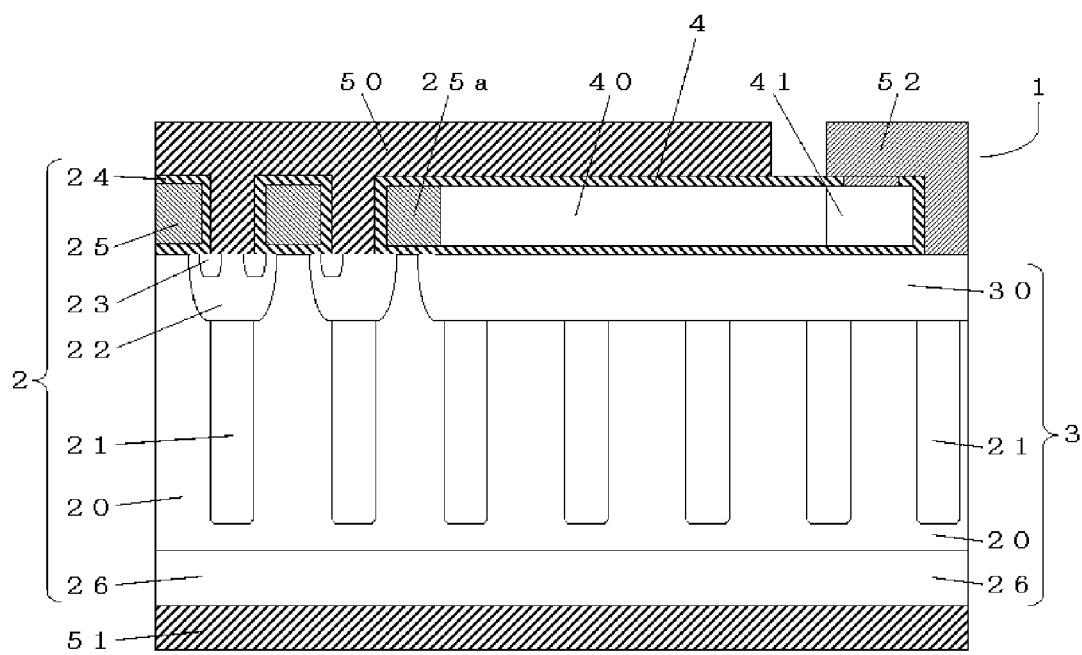
FIG. 1 is a cross-sectional view of a semiconductor device according to a first embodiment.

An aspect of the present invention is a semiconductor device comprising: a Metal Oxide Semiconductor Field Effect Transistor including: a semiconductor substrate including a first semiconductor layer of a first conductivity type; second semiconductor layers of a second conductivity type extending in a depth direction from one surface of the semiconductor substrate, and having space each other; third semiconductor layers of the second conductivity type formed on at least of the second semiconductor layers in one surface side of the semiconductor substrate; fourth semiconductor layers of the first conductivity type partially formed on a surface of the third semiconductor layers; each of control electrodes formed on a surface of the third semiconductor layer via an insulating film; a first electrode connected the third semiconductor layers and the fourth semiconductor layers; and a second electrode electrically connected on the other surface of the first semiconductor layer; a first diode including a fifth semiconductor layer of the second conductivity type contacting the second semiconductor layer in one surface side of the semiconductor substrate, the first semiconductor layer and the second semiconductor layers; and a cathode of a second diode including a seventh semiconductor layer connected to the control electrode, and an anode of the second diode connected to an anode of the first diode.

Another aspect of the present invention is a semiconductor device comprising: a Metal Oxide Semiconductor Field Effect Transistor including: a semiconductor substrate including a first semiconductor layer of a first conductivity type; trenches extending in a depth direction from one surface of the semiconductor substrate, and having space each other; implanting electrode formed in second main electrode side of the trenches via gate insulating film; control electrode formed in first electrode side of the trenches via gate insulating film; third semiconductor layers of the second conductivity type formed in one surface side of the semiconductor substrate; fourth semiconductor layers of the first conductivity type partially formed on a surface of the third semiconductor layers; a first electrode connected the third semiconductor layers and the fourth semiconductor layers; and a second electrode electrically connected on the other surface of the first semiconductor layer; a first diode including the first semiconductor layer and fifth semiconductor layer of the second conductivity type contacting the second semiconductor layers in one surface side of the semiconductor substrate; and a cathode of a second diode including a seventh semiconductor layer connected to the control electrode, and an anode of the second diode connected to an anode of the first diode.

Embodiments of the present invention will now be described with reference to the drawings. In the embodiments below, a first conductivity type is assumed to be an n-type, and a second conductivity type is assumed to be a p-type, however, the invention can be practiced also under that the first conductivity type may be the p-type and the second conductivity type may be the n-type.

First Embodiment

Figure 2:
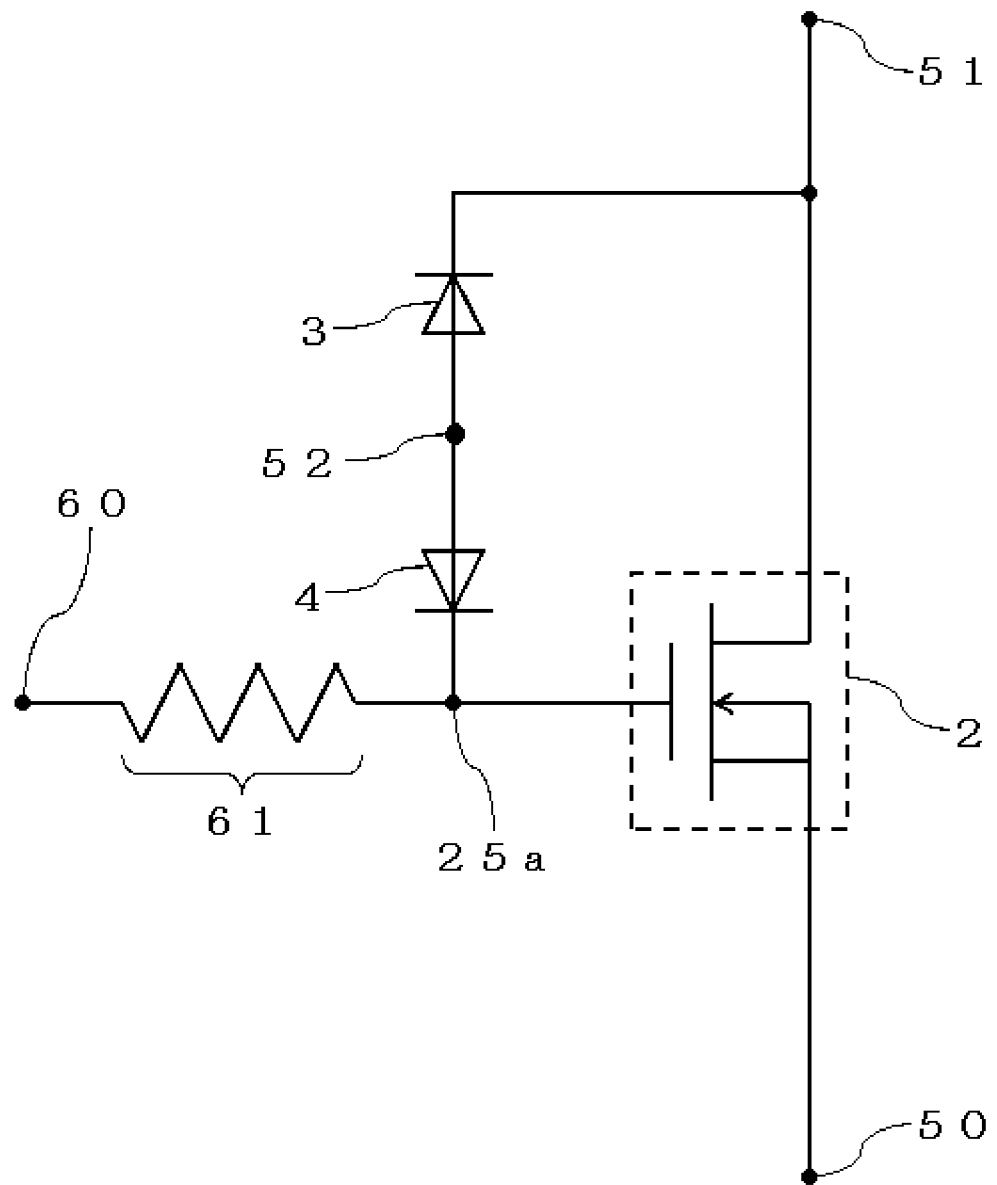
FIG. 2 is an equivalent circuit of the semiconductor device according to the first embodiment.

FIG. 1 shows a cross-sectional view of a semiconductor device according to a first embodiment, and FIG. 2 shows an equivalent circuit of the semiconductor device according to the first embodiment.

A semiconductor device 1 according to a first embodiment is provided with MOSFET 2, a first diode 3 and a second diode 4. The semiconductor device 1 is formed by an ion implantation method or an epitaxial growth for semiconductor substrate. In this embodiment, the semiconductor substrate is shown as an $n^-$ type drift layer 20 that is a first semiconductor layer. And many p type pillar layers 21 second semiconductor layers are extending in a depth direction from one surface of the $n^-$ type drift layer 20, and have a space each other. As a result, the $n^-$ type drift layer 20 and the p type pillar layer 21 are alternatively arranged (pn junction). The formation is generally called a super junction structure. The super junction structure has the same amount of charge (impurity amount) in each of the $n^-$ type drift layer 20 and the p type pillar layer 21. And it creates a pseudo-non-doped layer, holds a high breakdown voltage, and passes a current through the highly doped $n^-$ type drift layer 20 to realize a low ON resistance superior to that of the material limit.

P type base layers 22 as third semiconductor layers are formed on one surface of the $n^-$ type drift layer 20 so as to contact at least of the p type pillar layers 21. And n type source layers 23 as fourth semiconductor layers are selectively formed on the surface of the p type base layers 22.

P type clamp layer 30 as a fifth semiconductor layer is formed on one surface of the $n^-$ type drift layer 20 so as to contact at least of the p type pillar layers 21 which don't contact the p type base layers 22.

A gate insulating film 24 is formed on a region from the n type source layer 23 in one p type base layer 22 to the n type source layer 23 in the other p type base layer 22. For example, the gate insulating film 24 may be a silicon oxide film. Gate electrodes 25 as control electrodes are formed on the insulating film 24. For example, the gate electrodes 25 are made from a poly-silicon. Then, a source electrode 50 as a first electrode is formed on the p type base layers 22 and the n type source layer 23.

An $n^+$ type drain layer 26 as a sixth semiconductor layer is formed on the other surface of the $n^-$ type drift layer 20. And a drain electrode 51 as a second electrode is formed on the surface of the $n^+$ type drain layer 26. The $n^+$ type drain layer 26 is electrically connected to the drain electrode 51.

The MOSFET 2 is provided with the $n^-$ type drift layer 20, the p type pillar layers 21, the p type base layers 22, the n type source layer 23, the gate insulating film 24, the gate electrodes 25 and the $n^-$ type drain layer 26. And the first diode 3 includes the p type clamp layer 30, the $n^-$ type drift layer 20, the p type pillar layers 21 and the $n^+$ type drain layer 26.

Moreover, the second diode 4, which is formed on the p type clamp layer 30, is made from poly-silicon etc. same material of the gate electrode 25. In FIG. 1, as an example, the second diode 4 is a p-intrinsic-n diode. A gate electrode 25$a$ electrically connected the gate electrode 25 is cathode. And the second diode 4 includes a semiconductor layer 40 as a seventh semiconductor layer and a p type semiconductor layer 41 as an eighth semiconductor layer. The semiconductor layer 40 has impurity concentration lower than the p type semiconductor layer 41.

Then, a connecting junction 52 connected to the p type semiconductor layer 41 of the second diode 4 is electrically connected to the p type clamp layer 30 of the first diode 3. Specifically, an anode of the first diode 3 is electrically connected to an anode of the second diode 4. In addition, by controlling the impurity concentration and the thickness of the first diode 3, the breakdown voltage of the first diode 3 is configured so as to be lower than the breakdown voltage of the MOSFET 2.

In the semiconductor device 1, a predetermined voltage (a gate voltage of a threshold voltage or more) is applied to the gate electrode 25; a channel (an n type inversion layer) is formed in the surface of the p type base layers 22. Thus the $n^-$ type drift layer 20 and the n type source layer 23 are conductive. As a result, an electric current flows between the source electrode 50 and the drain electrode 51 through the n type source layer 23, the $n^-$ type drift layer 20 and the $n^+$ type drain layer 26. That is, the semiconductor device 1 turns on.

FIG. 2 shows an equivalent circuit of the semiconductor device 1 according to the first embodiment. A high-voltage is applied between the source electrode 50 and the drain electrode 51 when a signal don't input to an input terminal 60 connected to the terminal of the gate electrode 25$a$. At that time, avalanche breakdown occurs at the first diode 1, because the first diode 1 has a lower breakdown voltage than the MOSFET 2.

Therefore, an electric current flows from the first diode 3 to the input terminal 60 through the second diode 4 and a gate resistor 61. After the electric current flows, a voltage drop caused by the gate resistor 61 occurs. When an applied voltage to the gate electrode 25 exceeds the threshold voltage, the MOSFET 2 turns on and electric current flows from the drain electrode 51 to the source electrode 50.

As described above, a voltage depended on the breakdown voltage of the first diode 3 clamps between the source electrode 50 and the drain electrode 51, and electric current occurred by avalanche breakdown flow in the first diode 3. But, in the MOSFET 2, it is possible to flow a current between the source electrode 50 and the drain electrode 51 without the current occurred by avalanche breakdown.

It is easy for the first diode 3 to be higher avalanche breakdown than the MOSFET 2, because a parasitic bipolar transistor isn't formed in the first diode 3. Then, the avalanche current is small because voltage drop to set on MOSFET 2 only is occurred. Furthermore, an electric current in the MOSFET 2 isn't bipolar action but unipolar action, so the semiconductor device 1 is difficult to break. Therefore, the semiconductor device 1 can realize high avalanche withstanding capability characteristics.

The second diode 4, formed between the MOSFET 2 and the first diode 3, prevents an electric current to flow between the drain electrode 51 and the input terminal 60 when on-state signal (for example, 10V) inputs to the input terminal 60. Therefore, it is preferable that the breakdown voltage of the second diode 4 is equal to or more than or equal to essential input voltage (for example, equal to or more than 30V) in its operating.

Though the avalanche withstanding capability of the MOSFET 2 is low, the semiconductor device 1 can have high avalanche withstanding capability by connecting the anode of the second diode 4 to the anode of the first diode 3 being lower breakdown voltage than the MOSFET 2. Thus, it is flexible to design the $n^-$ type drift layer 20 in the MOSFET 2 so that the trade-off between ON resistance and breakdown voltage improves and ON resistance of the semiconductor device 1 decreases.

Furthermore, the electrical capacitance between the source electrode 50 and the drain electrode 51 increases because of the first diode 3 being connected between the source electrode 50 and the drain electrode 51. Therefore, it can be expected to improve switching speed of the MOSFET 2.

In FIG. 2, the gate resistor 61 is formed outside the MOSFET 2 or the second diode 4 and connected to outside. However, a gate resistance of the gate resistor 61 may be inside of the MOSFET 2 or be inside gate resistance and outside gate resistance.

Figure 3:
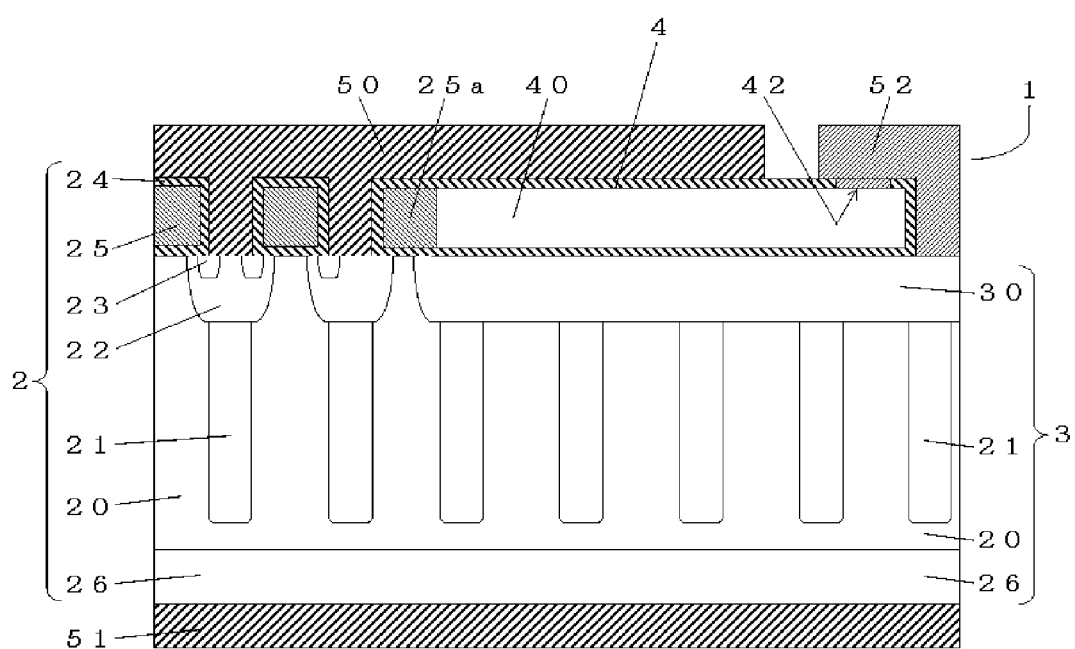
FIG. 3 is a cross-sectional view of the semiconductor device including Schottky barrier diode according to the first embodiment.

FIG. 3 shows a cross-sectional view of the semiconductor device including Schottky barrier diode according to the first embodiment. In FIG. 1, for example, the second diode 4 is p-intrinsic-n diode. However, as shown in FIG. 3, a Schottky barrier diode may be formed a Schottky junction 42 at interface between the low impurity concentration semiconductor layer 40 and the connecting junction 52 without the p type semiconductor layer 41.

In this embodiment, the second diode 4 is formed on the p type clamp layer 30, however the second diode 4 may be electrically connected the p type clamp layer 30, by using the connecting junction 52. The second diode 4 may be formed anywhere in the semiconductor device 1.

Second Embodiment

Figure 4:
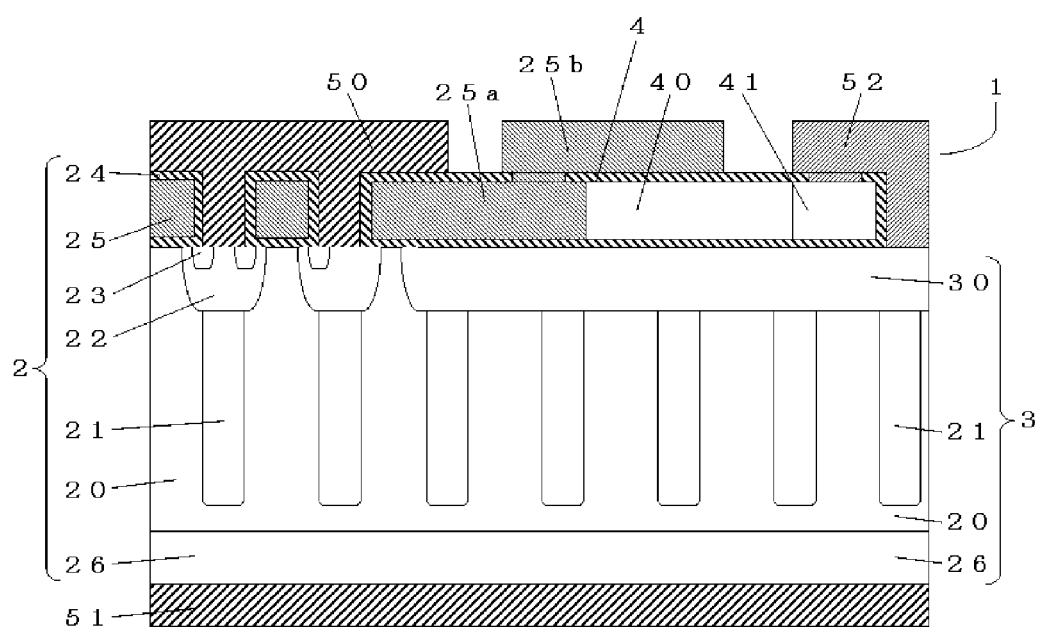
FIG. 4 is a cross-sectional view of the semiconductor device according to a second embodiment.

FIG. 4 shows a cross-sectional view of the semiconductor device according to a second embodiment. In regard to the various sections of the second embodiment, the same sections as those of the semiconductor device 1 shown in FIG. 1 are represented by the same symbols.

A semiconductor device 1 in the second embodiment differs from the semiconductor device 1 in the first embodiment in that a gate electrode 25b deriving the gate electrode 25a is formed in part of the source electrode 50 forming on upside of the second diode 4 and the first diode 3 and the second diode 4 are formed under the gate electrode 25b.

When the semiconductor device 1 (the MOSFET 2) is on-state, the first diode 3 and the second diode 4 are invalid region that don't flow current. The first diode 3 and the second diode 4 are generally invalid region. Therefore, in this embodiment, what the first diode 3 and the second diode 4 forming under the gate electrode 25b being originally invalid region lead to be decrease an area of invalid region and chip.

For the second embodiment, also, though the avalanche withstanding capability of the MOSFET 2 is low, the semiconductor device 1 can have high avalanche withstanding capability by connecting the anode of the second diode 4 to the anode of the first diode 3 being lower breakdown voltage than the MOSFET 2. Thus, it is flexible to design the n⁻ type drift layer 20 in the MOSFET 2 so that the trade-off between ON resistance and breakdown voltage improves and ON resistance of the semiconductor device 1 decreases.

Furthermore, the electrical capacitance between the source electrode 50 and the drain electrode 51 increases because of the first diode 3 being connected between the source electrode 50 and the drain electrode 51. Therefore, it can be expected to improve switching speed of the MOSFET 2.

Third Embodiment

Figure 5:
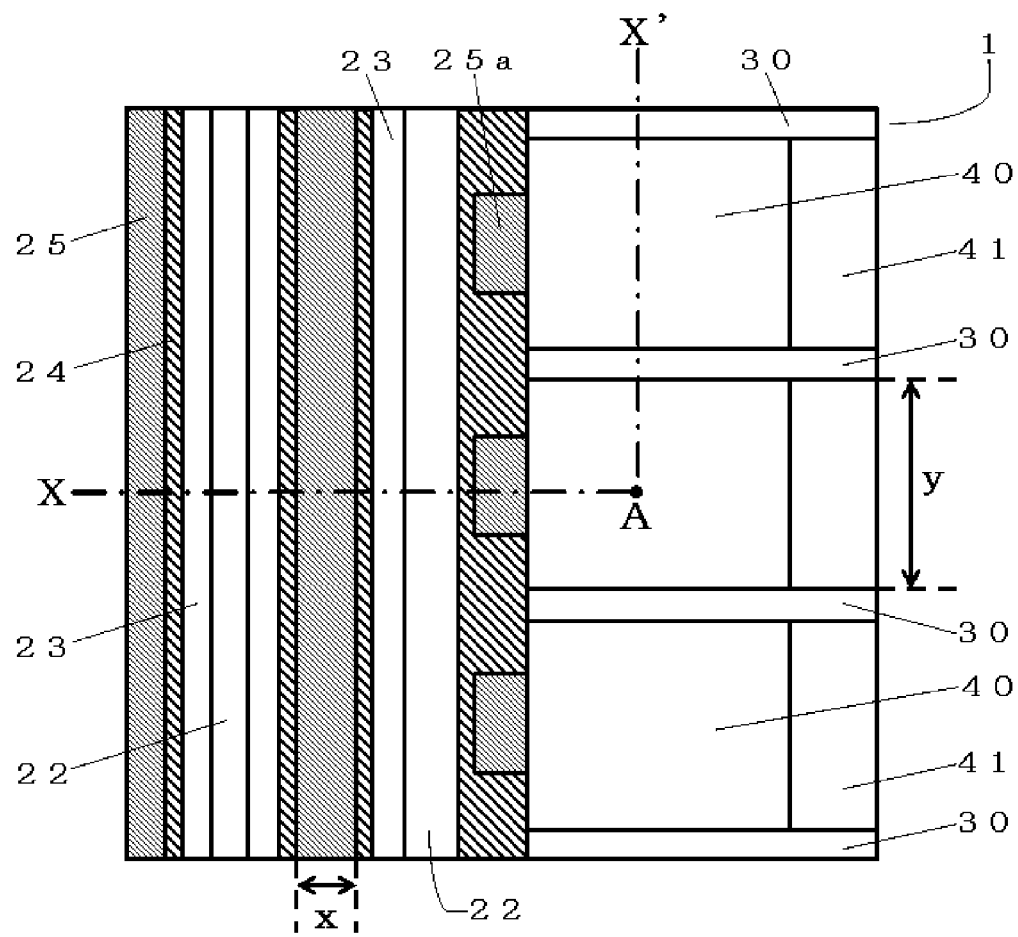
FIG. 5 is a plane view of the semiconductor device according to a third embodiment.
Figure 6:
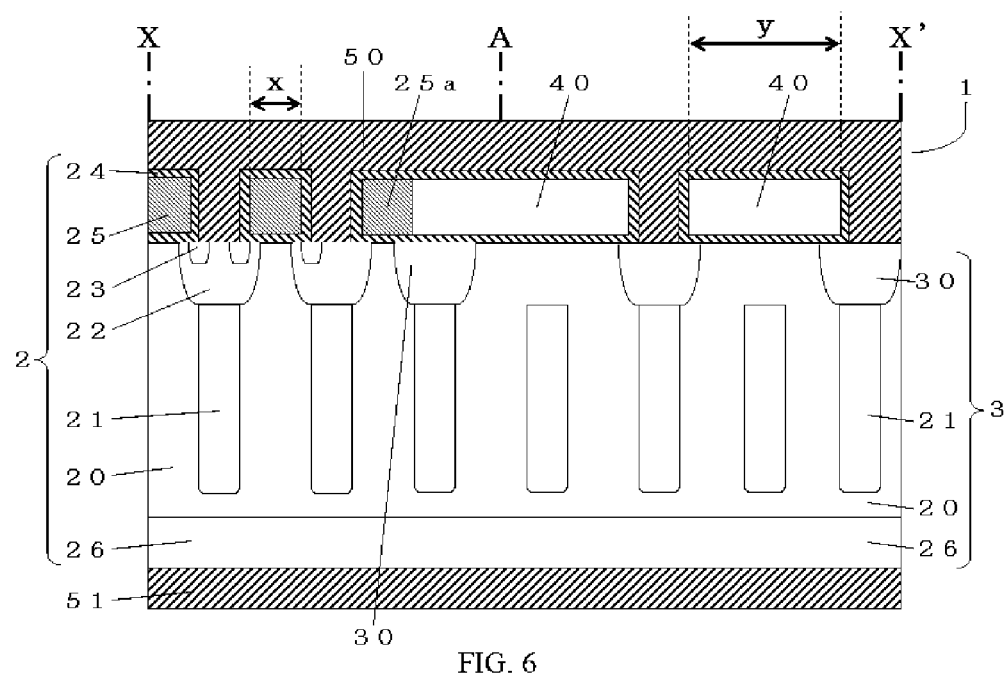
FIG. 6 is a cross-sectional view of main component along the line X-A-X' in FIG. 5.
Figure 7:
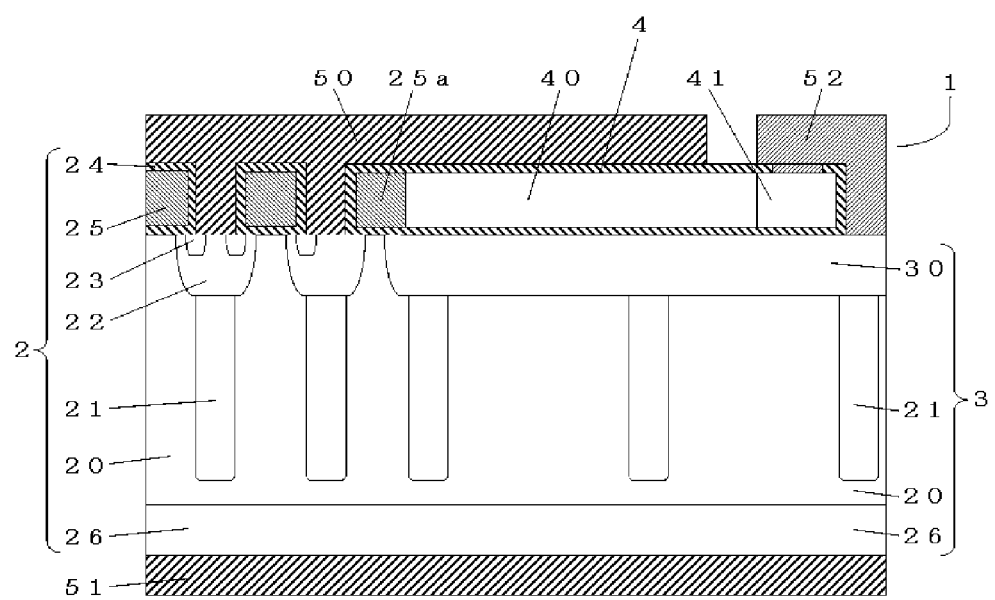
FIG. 7 is a cross-sectional view of an alternative of the semiconductor device according to the third embodiment.

FIG. 5 shows a plane view of the semiconductor device according to a third embodiment. FIG. 6 shows a cross-sectional view of main component along the line X-A-X' in FIG. 5. FIG. 7 shows a cross-sectional view of an alternative of the semiconductor device according to the third embodiment. In regard to the various sections of this third embodiment and the alternative, the same sections as those of the semiconductor device 1 shown in FIG. 1 are represented by the same symbols.

The semiconductor device 1 in the third embodiment differs from the semiconductor devices 1 in the first embodiment and the second embodiment in that a space between the p type clamp layers 30 is wider than a space between the p type base layers 22. By being this formation, an electric field concentration occur in a lower end of the p type clamp layer 30 (an upper end of the p type pillar layer 21) and it is possible to decrease a breakdown voltage of the first diode 3.

For example, as shown in FIG. 5, a length y of such as poly-silicon forming the low impurity concentration semiconductor layer 40 and the p type semiconductor layer 41 is longer than a length x of the gate electrode 25. As a result, as shown in FIG. 6, it is possible that the space between the p type clamp layers 30 forming with such as poly-silicon is longer than the space between the p type base layers 22 forming with the gate electrode 25.

In addition, as shown in FIG. 7, also by broadening formation cycle between the p type pillar layers 21 under the p type clamp layer 30, the electric field concentration occur in upper end of the p type pillar layer 21 and it is possible to decrease the breakdown voltage of the first diode 3.

For the third embodiment, also, though the avalanche withstanding capability of the MOSFET 2 is low, the semiconductor device 1 can have high avalanche withstanding capability by connecting the anode of the second diode 4 to the anode of the first diode 3 being lower breakdown voltage than the MOSFET 2. Thus, it is flexible to design the n⁻ type drift layer 20 in the MOSFET 2 so that the trade-off between ON resistance and breakdown voltage improves and ON resistance of the semiconductor device 1 decreases.

Moreover, the electrical capacitance between the source electrode 50 and the drain electrode 51 increases because of the first diode 3 being connected between the source electrode 50 and the drain electrode 51. Therefore, it can be expected to improve switching speed of the MOSFET 2.

Fourth Embodiment

Figures 8A, 8B:
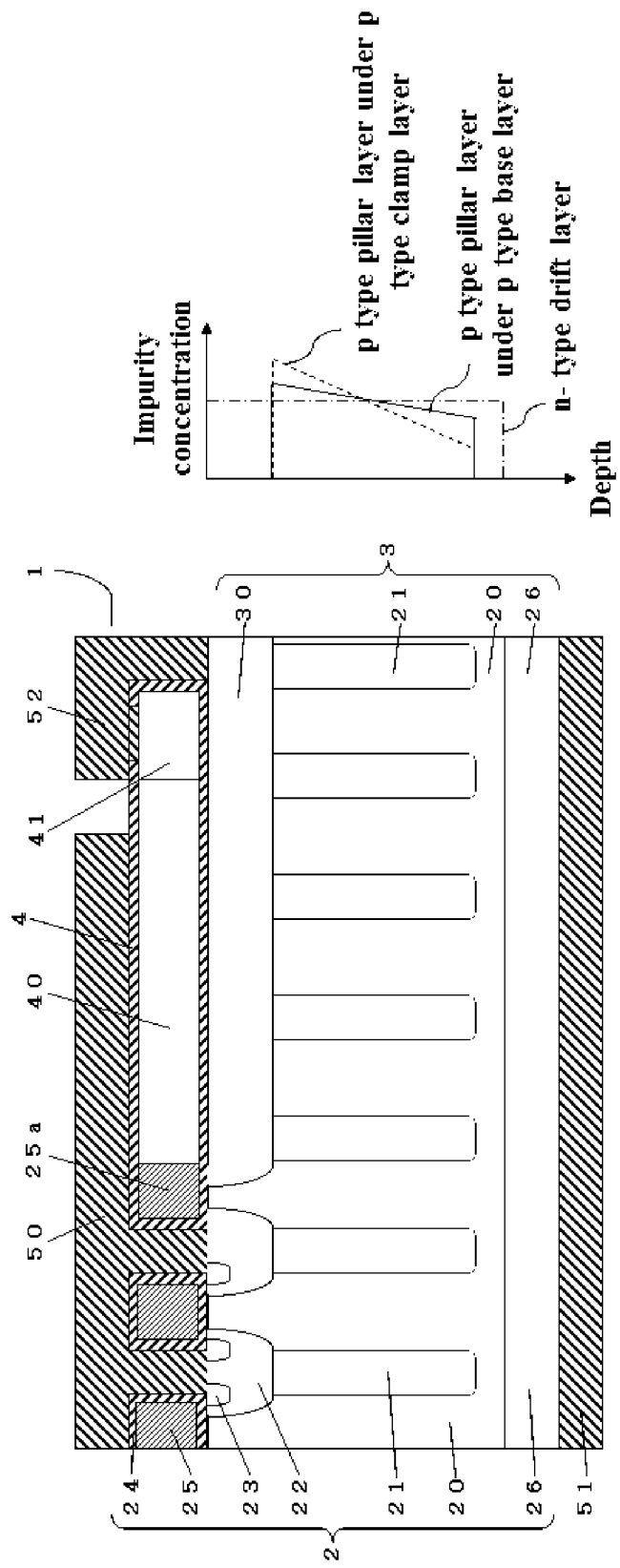
FIG. 8A is a cross-sectional view of the semiconductor device according to a fourth embodiment.
FIG. 8B is a graph illustrating an impurity concentration profile along the vertical direction (depth direction) of the portion illustrated in FIG. 8A.

FIG. 8A shows a cross-sectional view of the semiconductor device according to a fourth embodiment, and FIG. 8B shows a graph illustrating an impurity concentration profile along the vertical direction (depth direction) of the portion illustrated in FIG. 8A.

Each FIG. 9A, FIG. 9B, FIG. 10A and FIG. 10B show alternatives of the fourth embodiment. FIG. 9A shows a cross-sectional view of an alternative of the semiconductor device according to the fourth embodiment, and FIG. 9B shows a graph illustrating an impurity concentration profile along the cross direction of the portion illustrated in FIG. 9A. FIG. 10A shows a cross-sectional view of an alternative of the semiconductor device according to alternative of the fourth embodiment, and FIG. 10B shows a graph illustrating an impurity concentration profile along the cross direction of the portion illustrated in FIG. 10A. In regard to the various sections of this fourth embodiment and the alternatives, the same sections as those of the semiconductor device 1 shown in FIG. 1 are represented by the same symbols.

The semiconductor device 1 in the fourth embodiment differs from the semiconductor devices 1 in the first-third embodiments in that an impurity concentration of the n⁻ drift layer 20 and the p type pillar layer 21 is adjusted.

As shown in FIG. 8, the impurity concentration of the p type pillar layer 21 in the source electrode 50 side is higher profile than in the drain electrode 51 side. This impurity concentration profile results in decreasing an electric field of an upper and a lower end of a super junction structure, namely the p type pillar layer 21. Thus it is possible to improve avalanche breakdown.

In addition, in this embodiment, change in the impurity concentration along a vertical direction (a depth direction) of the p type pillar layer 21 under the p type clamp layer 30 is bigger than change in the impurity concentration along the vertical direction (the depth direction) of the p type pillar layer 21 under the p type base layer 22. As a result, it is possible that a breakdown voltage of the first diode 3 is certainly lower than a breakdown voltage between a drain and a source in the MOSFET 2 and avalanche breakdown of the first diode 3 increase.

Moreover, by this differing of change in the impurity concentration, change in the impurity concentration in the MOSFET 2 which doesn't require high avalanche withstanding capability is small. As a result, an effective impurity concentration of the n⁻ type drift layer 20 increases and it results in decrease in ON resistance of the semiconductor device 1. And increase in the effective impurity concentration of the n⁻ type drift layer 20 results in slow change to a drain voltage of a capacitance between a gate and a drain in the MOSFET 2. So a switching noise in the semiconductor devise 1 is reduced.

In FIG. 8, change in the impurity concentration of the p type pillar layer 21 is shown for example. However, the change can be illustratively the n⁻ type drift layer 20. When impurity the concentration of n⁻ type drift layer 20 is higher than the p type pillar layer 21 at the drain electrode 51 side and the impurity concentration of n⁻ type drift layer 20 is lower than the p type pillar layer 21 in the source electrode 50 side, same result is available.

Furthermore, as shown in FIG. 9, it can also be change in an impurity concentration difference between the n⁻ type drift layer 20 and the p type pillar layer 21. Generally, for increasing in avalanche breakdown, slightly increasing the impurity concentration of the p type pillar layer 21 is effective. Thus, it is desirable that the impurity concentration of the p type pillar layer 21 is higher than the impurity concentration of the n⁻ type drift layer 20 under the p type clamp layer 30 and the impurity concentration of the p type pillar layer 21 is lower than the impurity concentration of the n⁻ type drift layer 20 under the p type base layer 22 being allowed to be low avalanche withstanding capability.

As a result, it is possible to decrease ON resistance of the MOSFET 2. In addition, increase in the impurity concentration of the n⁻ type drift layer 20 under the p type base layer 22 results in slow change to the drain voltage of the capacitance between the gate and the drain in the MOSFET 2, and it reduces the switching noise of the semiconductor device 1. And increase in the effective impurity concentration of the n⁻ type drift layer 20 results in slow change to the drain voltage of the capacitance between the gate and the drain in the MOSFET 2.

If the breakdown voltage between the MOSFET 2 and the first diode 3 is only different, it is also possible to achieve by the impurity concentration of the n⁻ type drift layer 20 and p type pillar layer 21 under p type clamp layer 30 is higher than the impurity concentration of the n⁻ type drift layer 20 and p type pillar layer 21 under p type base layer 22 as shown in FIG. 10. By this impurity concentration profile, the breakdown voltage of the first diode 3 can certainly be lower than the breakdown voltage of the MOSFET 2 between the source electrode 50 and the drain electrode 52.

For the fourth embodiment, also, though the avalanche withstanding capability of the MOSFET 2 is low, the semiconductor device 1 can have high avalanche withstanding capability by connecting the anode of the second diode 4 to the anode of the first diode 3 being lower breakdown voltage than the MOSFET 2. Thus, it is flexible to design the n type drift layer 20 in the MOSFET 2 so that the trade-off between ON resistance and breakdown voltage improves and ON resistance of the semiconductor device 1 decreases.

Moreover, by controlling the impurity concentration of the n type drift layer 20 and p type pillar layer 21, it is possible that the breakdown voltage of the first diode 3 is certainly lower than the breakdown voltage of the MOSFET 2 between the source electrode 50 and the drain electrode 52, ON resistance of the MOSFET 2 is reduced, avalanche breakdown of the first diode 3 is improved and the switching noise of the semiconductor device 1 decrease.

Fifth Embodiment

Figure 11:
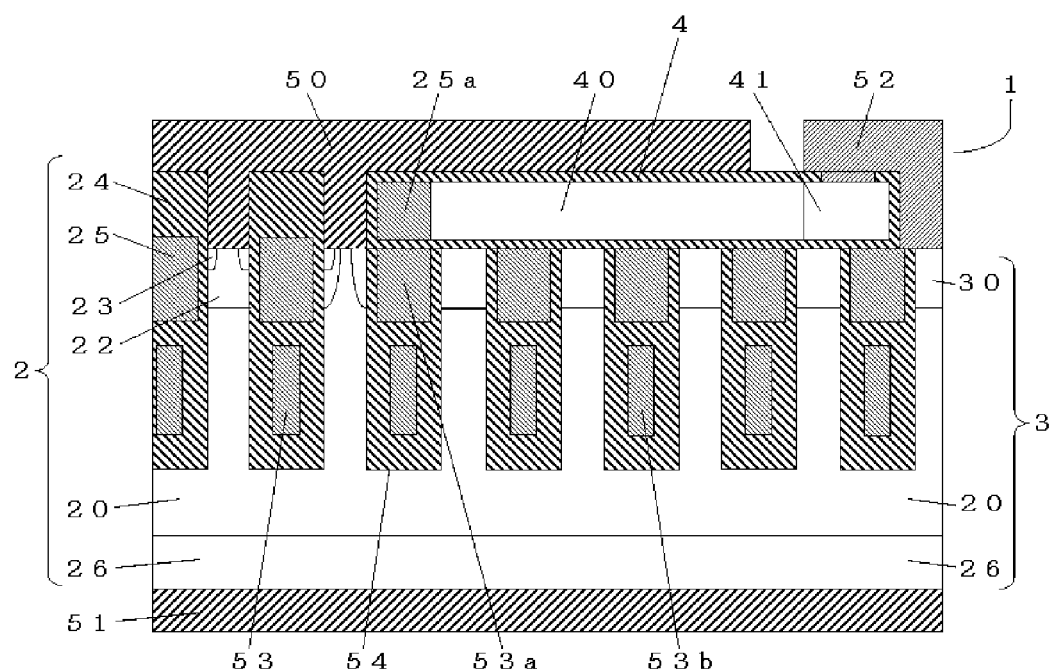
FIG. 11 is a cross-sectional view of the semiconductor device according to a fifth embodiment.
Figure 12:
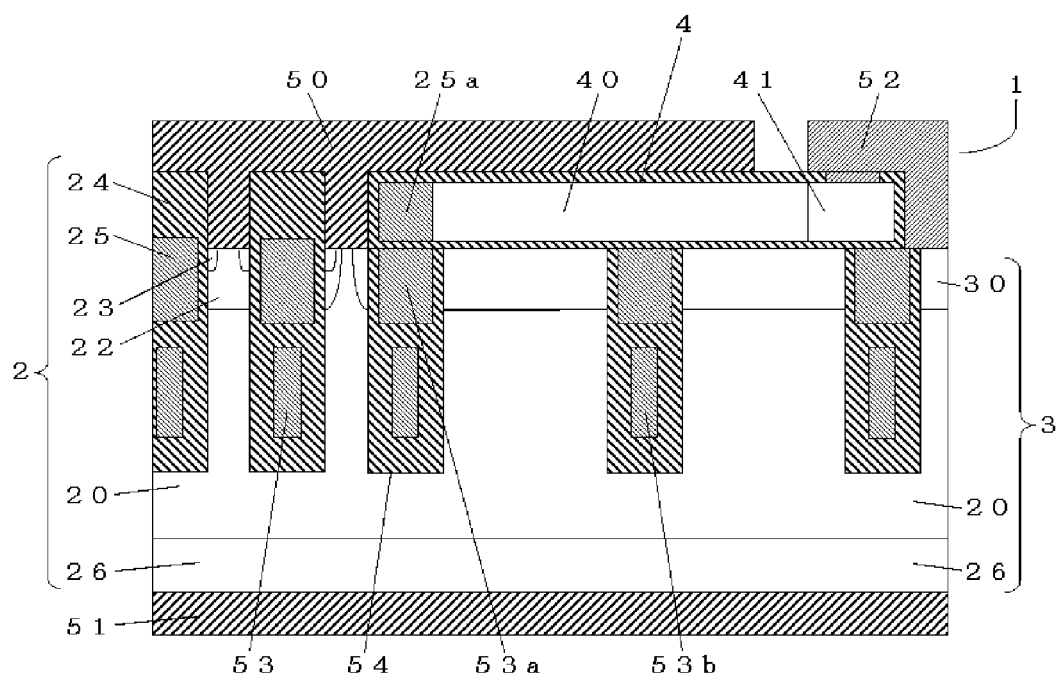
FIG. 12 is a cross-sectional view of an alternative of the semiconductor device according to alternative of the fifth embodiment.

FIG. 11 shows a cross-sectional view of the semiconductor device according to a fifth embodiment, and FIG. 12 shows a cross-sectional view of an alternative of the semiconductor device according to alternative of the fifth embodiment. In regard to the various sections of this fifth embodiment and the alternative, the same sections as those of the semiconductor device 1 shown in FIG. 1 are represented by the same symbols.

The semiconductor device 1 in the fifth embodiment differs from the semiconductor devices 1 in the first-fourth embodiments in that the semiconductor device 1 is a trench gate formation and a implanted electrode 53 is formed under the gate electrode 25 in a trench 54.

As shown in FIG. 11, the trenches 54 are formed in the ft type drift layer 20 and the implanted electrodes 53 in the trenches 54 are formed on the gate insulating film 24. As a result, it is possible to the increase impurity concentration of the n type drift layer 20 and decrease ON resistance of the semiconductor device 1.

Also in the semiconductor device 1 formed the implanted electrode 53, it is possible to improve the avalanche withstanding capability by similarly forming the equivalent circuit shown in FIG. 2 of the first embodiment.

It can also be connecting the implanted electrode 53 to the source electrode 50 or the gate electrode 25. And the trench 54 adjoining the p type clamp layer 30 is formed, the implanted electrode 53a in an upside of the trench 54 is formed on the gate insulating film 24 and the implanted electrode 53b in a downside of the trench 54 is formed on the gate insulating film 24. It can also be connecting the implanted electrodes 53a and 53b to the source electrode 50 or the gate electrode 25.

As the alternative shown in FIG. 12, what is space between the p type clamp layer 30 and the trench 54 is be wider than space between the p type base layer 22 and the trench 54 can result that the breakdown voltage of the first diode 3 is lower than the breakdown voltage of the MOSFET 2. As a result, stable avalanche withstanding capability is achieved.

Furthermore, it is also possible to achieve decreasing the breakdown voltage of the first diode 3 by increasing the impurity concentration of the n⁻ type drift layer 20 under the p type clamp layer 30.

A structure of the device edge termination portion is not particularly described, however, any edge termination structure such as a RESURF (Reduced SURface Field) structure and a guard ring structure can be used for implement.

The method of forming the semiconductor device 1 isn't only forming process of a super junction structure, but also processes repeating ion implantation and crystal growth, doing many ion implantation with changing acceleration voltage and doing crystal growth after forming trench.

The MOSFET based on silicon (Si) as a semiconductor has been described, however, the semiconductor can be illustratively based on a compound semiconductor such as silicon carbide (SiC) and gallium nitride (GaN), and a wide gap semiconductor such as diamond.

Moreover, the embodiments are mainly formed by method using both ion implantation and epitaxial growth, however, the forming method can also be only ion implantation method or only epitaxial growth.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a semiconductor substrate;
   a transistor including:
   a first semiconductor layer of a first conductivity type in the semiconductor substrate;
   second semiconductor layers of a second conductivity type provided in extending in a depth direction from a first surface of the semiconductor substrate and spaced apart from each other, a portion of the first semiconductor layer being between adjacent second semiconductor layers;
   third semiconductor layers of the second conductivity type provided on at least some second semiconductor layers, the third semiconductor layers being provided on a first surface side of the first semiconductor layer;
   a fourth semiconductor layer of the first conductivity type disposed on a first portion of a surface of at least one of the third semiconductor layers;
   a control electrode on a second portion of the surface of the at least one of the third semiconductor layers via an insulating film;
   a first electrode contacting the third semiconductor layers and the fourth semiconductor layer; and
   a second electrode under a second surface side of the first semiconductor layer opposite to the first surface side, the second electrode electrically connected to the first semiconductor layer;
   an extracting electrode electrically connected to the control electrode, the extracting electrode being on the first surface side of the first semiconductor layer;
   a first diode including a portion of the first semiconductor layer, a part of the second semiconductor layers, and a fifth semiconductor layer of the second conductivity type that is disposed in the semiconductor substrate, the first diode being under the extracting electrode; and
   a second diode including a seventh semiconductor layer as a cathode connected to the control electrode, an anode of the second diode being connected to an anode of the first diode, the second diode being under the extracting electrode,
   wherein a breakdown voltage of the first diode is lower than a breakdown voltage of the transistor.

2. The semiconductor device according to claim 1, wherein an avalanche breakdown in the first diode produces a voltage drop to operate the transistor.

3. The semiconductor device according to claim 1, wherein a space between adjacent fifth semiconductor layers is wider than a space between adjacent third semiconductor layers.

4. The semiconductor device according to claim 1, wherein a space between the second semiconductor layers in the first diode is wider than a space between the second semiconductor layers in the transistor.

5. The semiconductor device according to claim 1, wherein an impurity concentration of each second semiconductor layer increases from the second surface side towards the first surface side.

6. The semiconductor device according to claim 1, wherein an impurity concentration of each of the second semiconductor layers in the first diode is higher than an impurity concentration of each of the second semiconductor layers in the transistor.

7. The semiconductor device according to claim 1, wherein an impurity concentration of the second semiconductor layers in the first diode is higher than an impurity concentration of the first semiconductor layer in the first diode, and an impurity concentration of the second semiconductor layers in the transistor is lower than an impurity concentration of the first semiconductor layer in the transistor.

8. The semiconductor device according to claim 1, wherein an impurity concentration of the first semiconductor layer and the second semiconductor layers is higher in the first diode than in the transistor.

9. The semiconductor device according to claim 1, wherein the second diode is a Schottky barrier diode.

10. The semiconductor device according to claim 1, wherein the second diode is a p-intrinsic-n diode.

11. The semiconductor device according to claim 1, wherein the second diode comprises polysilicon.

12. The semiconductor device according to claim 1, wherein a breakdown voltage between the second electrode and the first electrode is higher than a breakdown voltage between a connecting junction between the fifth semiconductor layer and the seventh semiconductor layer and the first electrode.

13. The semiconductor device according to claim 1, wherein a breakdown voltage of the second diode is greater than or equal to 30 V.

* * * * *